(12) United States Patent
Felton et al.

(10) Patent No.: US 9,578,777 B1
(45) Date of Patent: Feb. 21, 2017

(54) UNIVERSAL MEZZANINE CONNECTOR

(71) Applicant: EMC IP HOLDING COMPANY LLC, Hopkinton, MA (US)

(72) Inventors: Mickey Steven Felton, Sterling, MA (US); Robert P. Wierzbicki, Worcester, MA (US); Michael Gregoire, Waltham, MA (US); Ralph C. Frangioso, Jr., East Falmouth, MA (US); Jiabing Li, Cary, NC (US); Justin Bandholz, Apex, NC (US)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 0 days.

(21) Appl. No.: 14/664,540

(22) Filed: Mar. 20, 2015

(51) Int. Cl.
| | |
|---|---|
| *G11B 33/02* | (2006.01) |
| *H05K 7/00* | (2006.01) |
| *H05K 5/00* | (2006.01) |
| *H05K 7/14* | (2006.01) |
| *G06F 1/16* | (2006.01) |
| *H01R 43/20* | (2006.01) |

(52) U.S. Cl.
CPC .......... *H05K 7/1422* (2013.01); *G06F 1/1613* (2013.01); *H01R 43/205* (2013.01)

(58) Field of Classification Search
CPC ...................................................... G06F 1/185
USPC ...................................... 361/679.01–679.03
See application file for complete search history.

(56) References Cited

U.S. PATENT DOCUMENTS

| | | | |
|---|---|---|---|
| 2003/0099096 A1* | 5/2003 | Megason ............ | H05K 7/1405 361/759 |
| 2005/0122703 A1* | 6/2005 | Fan ...................... | H05K 7/1408 361/801 |

* cited by examiner

*Primary Examiner* — Jerry Wu
(74) *Attorney, Agent, or Firm* — Day Pitney LLP (57) ABSTRACT

A computing system includes a low-profile chassis a motherboard disposed therein and at least one full-size circuit board coupled to the motherboard within the chassis. A method and another computing system are disclosed.

16 Claims, 7 Drawing Sheets

UNIVERSAL MEZZANINE CONNECTOR

BACKGROUND OF THE INVENTION

1. Field of the Invention

The invention disclosed herein relates to connection of mezzanine boards within computer systems, and in particular to methods and apparatus for connecting a diversity of board styles.

2. Description of the Related Art

A mezzanine board is a circuit board meant to be an extension or "daughter" of a motherboard (also referred to as a "mainboard"). Occasionally, the mezzanine board may be an extension of another board. The mezzanine board may be known by other names such as "piggyback board," "daughterboard," and by other similar terms. Generally, the mezzanine board will have plugs, sockets, pins, connectors, or other attachments for connection to other boards. A mezzanine board will usually plug into another board directly rather than through a computer bus.

A PCI Mezzanine Card (or PMC) is a printed circuit board manufactured to the IEEE P1386.1 standard (this standard is incorporated by reference herein in it's entirety). This standard combines the electrical characteristics of the PCI bus with the mechanical dimensions of the Common Mezzanine Card or CMC format (IEEE 1386 standard). The mechanics of a common mezzanine card (CMC) family are defined in this standard. Mezzanine cards, designed to this standard, can be used with a variety of motherboards, desktop computers, portable computers, servers, and other similar types of applications. Mezzanine cards can provide modular front panel I/O, backplane I/O or general function expansion or a combination for host computers. Single wide mezzanine cards according to this standard are about 75 mm wide by 150 mm deep by 8.2 mm high. The standard also defines a double-sized card.

Unfortunately, with a diversity of suppliers, users very often are not be able to make use of existing equipment or mix components in a cost-effective manner. Worse yet, some motherboards do not permit use of mezzanine boards at all. Accordingly, the functionality that may be obtained with a mezzanine board is not achievable.

Thus, what are needed are methods and apparatus that provide for mezzanine style connection in order to save cost of connector on systems with no mezzanine option. Preferably, the methods and apparatus enable functions such as a local area network (LAN) and provide a route out the front for open compute boxes. Further, the methods and apparatus should allow for larger heat sinks, higher power devices, drop in access of mezzanine cards then previously achievable.

SUMMARY OF THE INVENTION

In one embodiment, a computing system is disclosed. The computing system includes a low-profile chassis a motherboard disposed therein and at least one full-size circuit board coupled to the motherboard within the chassis.

The full-size circuit board may be coupled to the motherboard by a co-edge connector. The full-size circuit board may be coupled to the motherboard by a co-planar connector. The low-profile chassis may exhibit dimensions for one of a 1U computer server and a 2U computer server. The low-profile chassis may be a laptop computer. The full-size circuit board may be a PCI Express compliant circuit board. The full-size circuit board may be coupled to the motherboard with a connector which is also connected to an adapter. The full-size circuit board may be one of: a local area network (LAN) interface, a graphics adapter, a memory board, a controller for a data storage system, a network interface controller (NIC), an additional central processing unit (CPU), a wireless interface, at least one of an analog to digital converter and a digital to analog converter, a modem, a security device, and accelerator, and a sound card. The full-size circuit board may be coupled to the motherboard by a connector that provides an edge-to-edge connection.

In another embodiment, a method for retrofit of a low-profile computing system is provided. The method includes: selecting a full-size circuit board for use with the low-profile computing system; coupling a connector to the full-size circuit board; orienting the full-size circuit board to fit within a chassis of the low-profile computing system; and coupling the connector to a motherboard of the low-profile computing system.

In another embodiment, a computing system is disclosed. The computing system includes a chassis that includes a motherboard disposed therein and a plurality of mezzanine boards coupled to the motherboard, each mezzanine board substantially parallel to another one of the mezzanine boards and coupled to the motherboard with an edge-to-edge connector.

BRIEF DESCRIPTION OF THE DRAWINGS

The features and advantages of the invention are apparent from the following description taken in conjunction with the accompanying drawings in which.

DETAILED DESCRIPTION OF THE INVENTION

Disclosed herein are methods and apparatus for enabling the use of a variety of application specific circuit boards within a motherboard. By application of the teachings disclosed herein, users and system owners are able to reconfigure the physical arrangement of the circuit boards. This may result in increased diversity of components, increased capacity, improved airflow, cost savings and other advantages while maintaining operability.

In order to provide some context for the teachings herein, some aspects of the technology are now introduced.

As discussed herein, the term "motherboard" generally refers to a printed circuit board that contains components providing computing functionality and is the central component within a server. Generally, the motherboard contains circuitry that will host a mezzanine board in a manner described herein. For example, the motherboard may host or include at least one central processing unit (CPU), memory (such as random access memory (RAM), read only memory (ROM)), at least one type of controller, a bus to provide communication with peripheral devices such as a hard disk drive (HDD), and the like.

As discussed herein, the term "circuit board" generally refers to a printed circuit board that is to be coupled to a motherboard. In the exemplary embodiment, the circuit board is a mezzanine board that is intended to be coupled to a motherboard within a server. However, this is not intended to be limiting. That is, although the teachings disclosed herein refer to a "mezzanine board," this is not to imply constraints regarding orientation of the circuit board that is to be coupled to the motherboard.

As discussed herein, embodiments of connectors provide for arrangement of circuit boards in ways that were not previously achievable. Specifically, and by way of non-limiting example, embodiments of connectors provide for incorporation of oversized form factor circuit boards in computing components for this was not previously achievable. For example, incorporation of a PCI express card within a 1U server.

Figure 1:
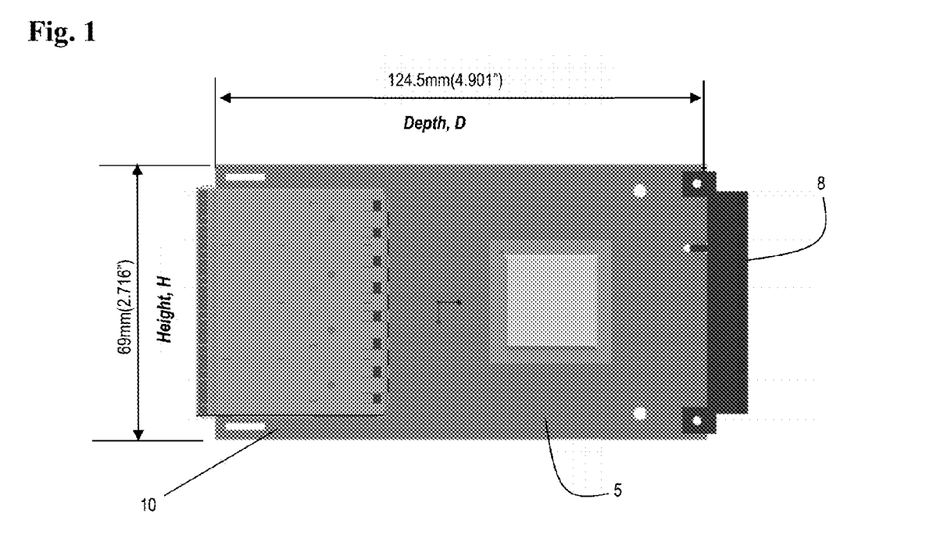
FIG. 1 is an illustration of an embodiment of a conventional mezzanine board with a rear mount configuration that is connected to a co-edge connector according to the teachings herein.

Referring now to FIG. 1, an exemplary embodiment of a mezzanine board 10 is shown. In this example, the mezzanine board 10 is a rear mount board 5. That is, the mezzanine board 10 is configured for connection to a computing system on the side of the mezzanine board 10 that opposes external connections. In this example, the mezzanine board 10 provides a local area network (LAN) interface. The exemplary mezzanine board 10 includes a co-edge connector 8 disposed thereon.

Figure 2:
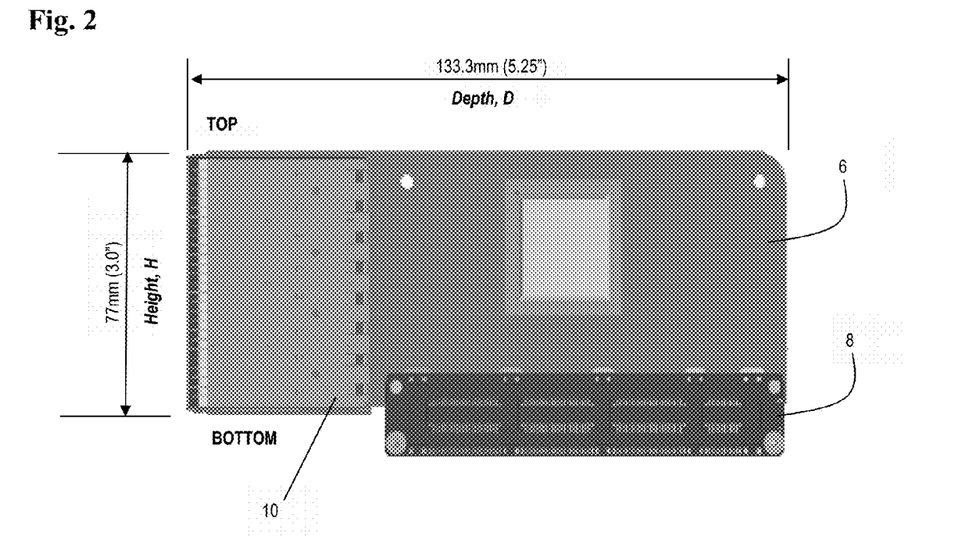
FIG. 2 is an illustration another embodiment of the conventional mezzanine board with a side mount configuration that is connected to another example of the co-edge connector according to the teachings herein.

Referring now to FIG. 2, another exemplary embodiment of the mezzanine board 10 is shown. In this example, the mezzanine board 10 is configured as a side-mount board 6. That is, the mezzanine board 10 is configured for connection to a computing system on the side of the mezzanine board 10 that is perpendicular to external connections. In this example, the mezzanine board 10 provides a local area network (LAN) interface. The exemplary mezzanine board 10 includes a connector 8 disposed thereon. In the embodiment shown, the connector 8 is referred to as a "co-edge connector 8."

Figure 3:
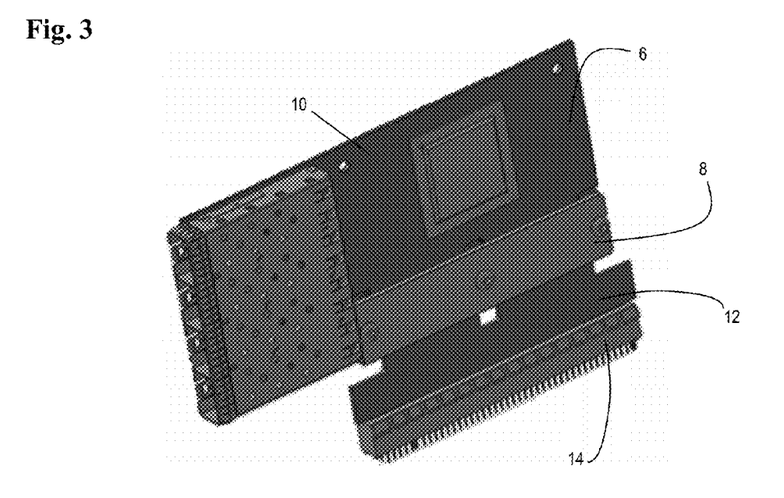
FIG. 3 is an illustration of the mezzanine board of FIG. 2 coupled to an adapter by an embodiment of the co-edge connector according to the teachings herein.

Referring now to FIG. 3, yet another exemplary embodiment of the mezzanine board 10 is shown. In this example, the mezzanine board 10 includes a side-mount board 6. An adapter board 12 is coupled to the co-edge connector 8 disposed thereon. The adapter board 12 is also connected to a conventional connector 14. An exemplary conventional connector 14 includes a PCI express connector.

In the exemplary embodiments, the mezzanine board 10 has dimensions of a PCI express card. Dimensions for PCI express cards are provided in Table 1 below.

TABLE 1

| Dimensions of PCI Express Boards | | | |
| --- | --- | --- | --- |
| Link Width | | Height, H | Depth, D |
| X1, X4, X8 | Standard height, half card length | 111.15 mm (4.376 inches max) | 167.65 mm (6.600 inches max) |
| X1, X4, X8, X16 | Standard height, full length cards | 111.15 mm (4.376 inches max) | 312.00 mm (12.283 inches max) |
| | Low profile cards | 68.90 mm (2.731 inches max) | 167.65 mm (6.600 inches max) |

As discussed herein, the height, H, of the mezzanine board 10 is to be construed according to the orientation shown in FIGS. 1 and 2. That is, although the mezzanine board 10 is to be disposed within a computing system, the height, H, of the mezzanine board 10 is to be construed according to the embodiments depicted, regardless of reorientation of a respective mezzanine board 10.

As discussed herein, any "standard size" circuit board or mezzanine board generally refers to circuit boards or mezzanine boards that are not specifically designed to be compact and fit within a low-profile computing system. That is, a "standard size" circuit board generally refers to a conventional, full size, circuit board that is compliant with standards such as the PCI express standard incorporated herein.

Figures 4A, 4B:
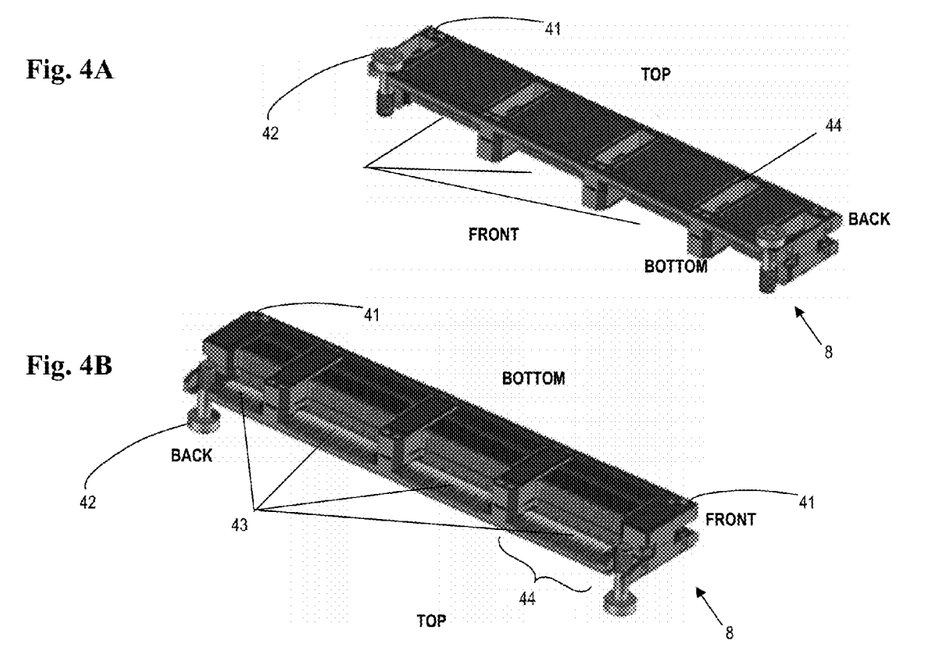
FIGS. 4A and 4B, collectively referred to herein as FIG. 4, present illustrations of a co-edge connector for the mezzanine board of FIGS. 1 and 2.

Turning now to FIGS. 4A and 4B, perspective views of an exemplary co-edge connector 8 are provided. In FIG. 4A, the co-edge connector 8 is shown from the top and in FIG. 4B, the co-edge connector 8 is shown from the bottom. The co-edge connector 8 includes a body 44. At least one bay 43 is disposed on each side of the co-edge connector 8. Each bay 43 includes at least one electrical contact 44. In the example shown, each bay 43 includes a plurality of electrical contacts 44.

The exemplary co-edge connector 8 includes a fastener receiving area 41 disposed at opposing ends thereof. Opposite to each of the fastener receiving areas 41 is a screw 42. Collectively, the fastener receiving areas 41 (and the implied fastener) and the screws 42 provide for coupling of the mezzanine board 10 to a motherboard.

Figure 5A:
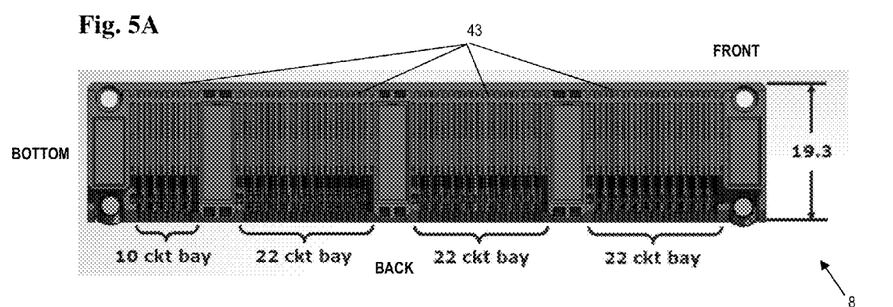
FIGS. 5A and 5B, collectively referred to herein as FIG. 5, present additional illustrations of the co-edge connector of FIG. 4.
Figure 5B:
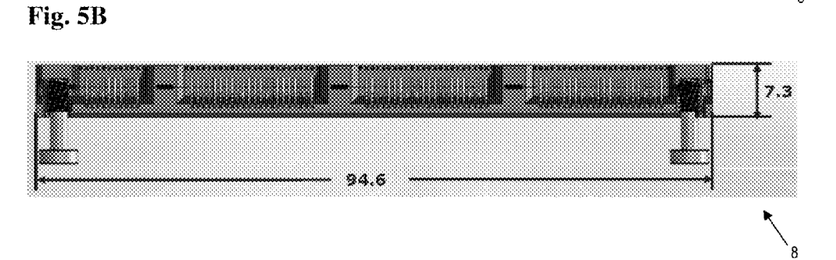

In FIG. 5A, the exemplary embodiment of the co-edge connector 8 is shown from the bottom. In this example, the co-edge connector 8 includes three bays 43 that include twenty two (22) electrical contacts 44. The fourth one of the bays 43 includes ten (10) electrical contacts 44. Accordingly, the co-edge connector 8 is considered "polarized." That is, by including an asymmetric arrangement of electrical contacts 44, it is not possible to reverse the co-edge connector 8 during installation. FIG. 5B depicts the exemplary co-edge connector 8 from the side. In this example, the co-edge connector 8 is about 7.3 mm tall, and about 94.6 mm wide.

Figure 6:
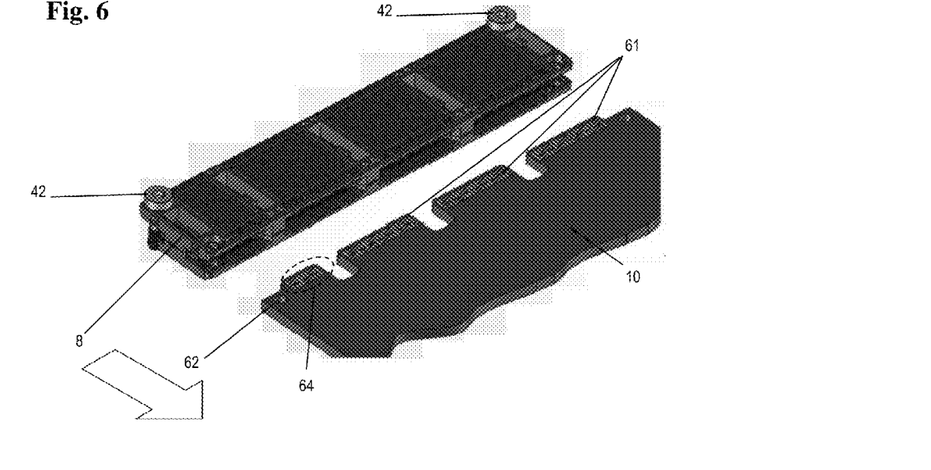
FIG. 6 is an illustration of the co-edge connector of FIGS. 4 and 5 in relation to a mezzanine board.

FIG. 6 depicts the co-edge connector 8 in relation to the exemplary mezzanine board 10. In this example, the mezzanine board 10 includes a plurality of fingers 61. Each one of the fingers 61 correlates to a respective one of the bays 43 within the co-edge connector 8. Disposed on each one of the fingers 61 is a plurality of board contacts 64. Each of the board contacts 64 correlates to a respective one of the electrical contacts 44. Accordingly, as the co-edge connector 8 is disposed over the mezzanine board (as indicated by the directional arrow), the electrical contacts 44 of the co-edge connector 8 will make electrical contact and connection with the board contacts 64, and therefore other components within the mezzanine board 10.

Figure 7:
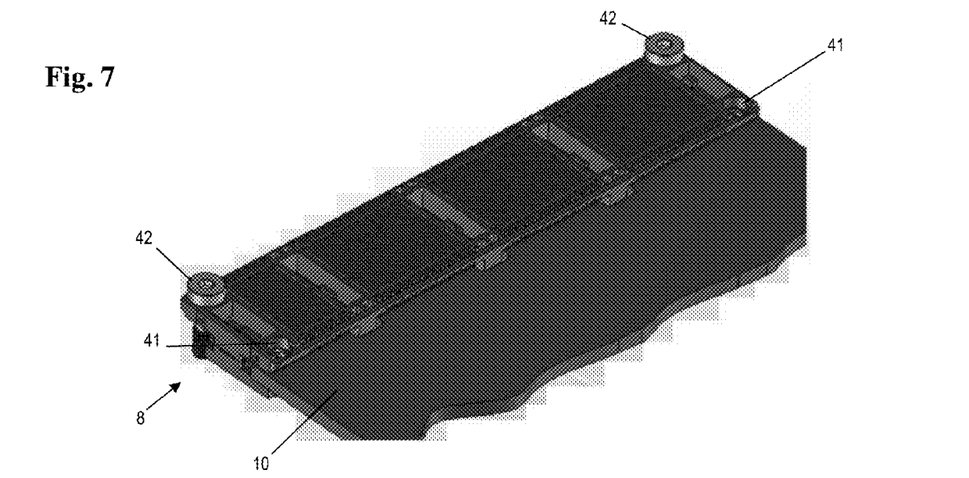
FIG. 7 is an illustration of the co-edge connector mounted to the mezzanine board.

In this example, the mezzanine board 10 further includes at least one fastener thruway 62. The arrangement of fastener thruways 62 is included in the mezzanine board 10 correlate to the fastener receiving areas 41 disposed in the co-edge connector 8. FIG. 7 illustrates the co-edge connector 8 positioned onto the mezzanine board 10. In this example, each of the fastener thruways 62 is aligned with a respective one of the fastener receiving areas 41.

Figure 8A:
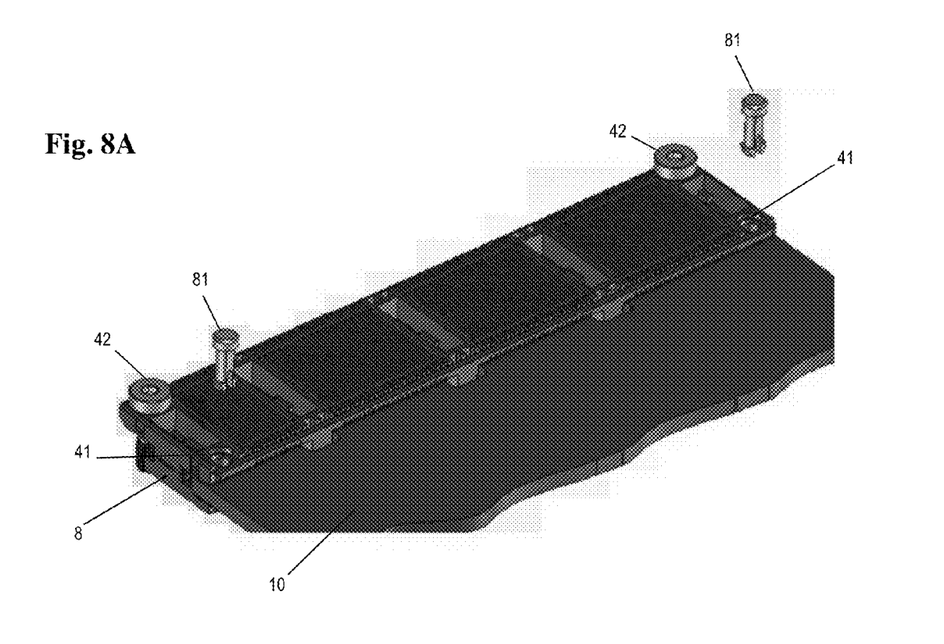
FIGS. 8A and 8B, collectively referred to herein as FIG. 8, depicts aspects of a process for securing the co-edge connector to the mezzanine board.

As shown in FIG. 8A, once the co-edge connector 8 has been disposed onto the mezzanine board 10, positioned appropriately, a fastener 81 is used to secure the co-edge connector 8 to the mezzanine board 10. In this example, each fastener 81 is inserted through a respective one of the fastener receiving areas 41, through the respective fastener thruway 62, and secured.

Figure 8B:
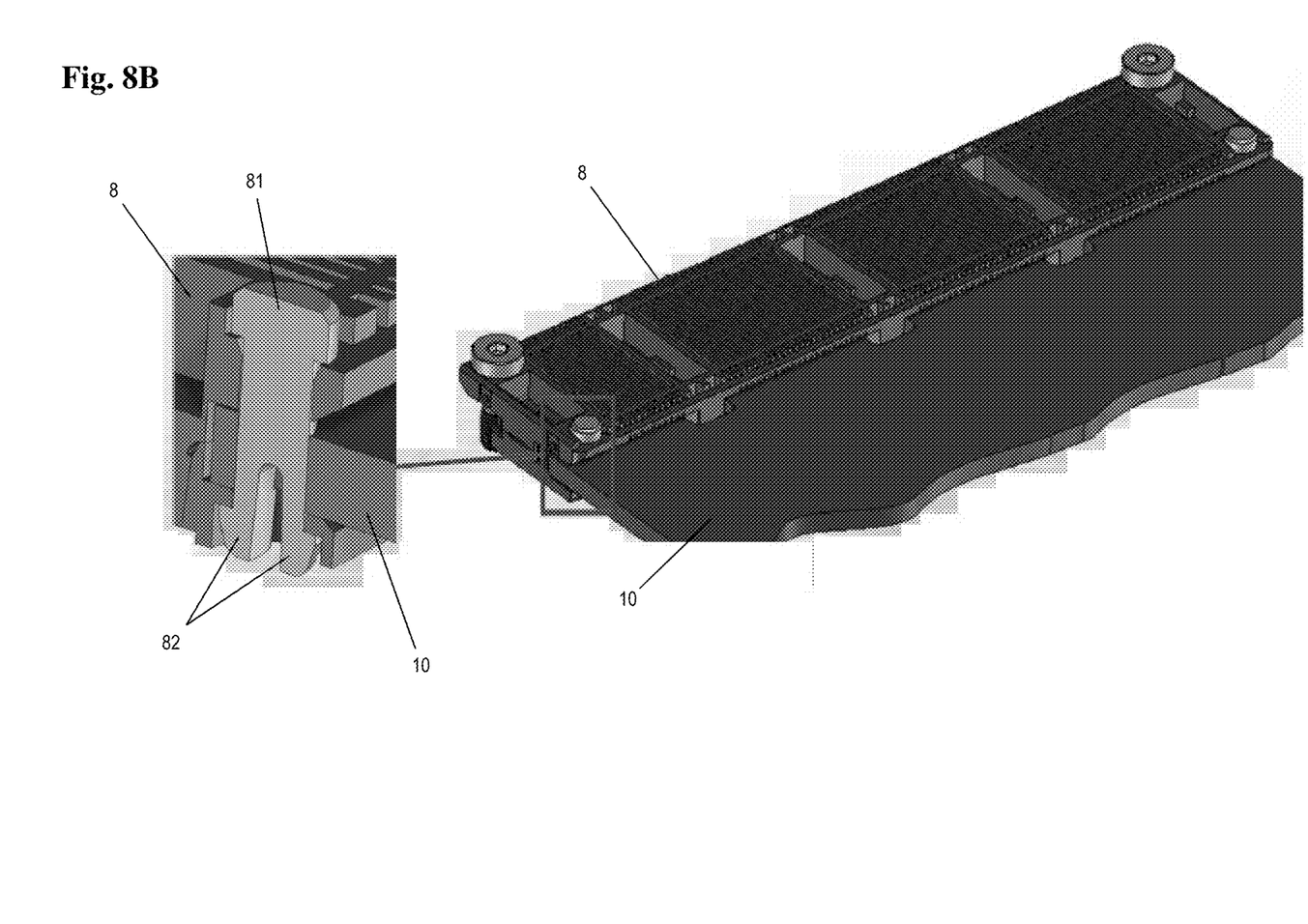

As shown in FIG. 8B, the fastener 81 may incorporate a particular design such that the co-edge connector 8 is securely locked onto the mezzanine board 10. In this example, the fastener 81 includes a rivet with compressible arms 82 disposed in a distal end thereof. As the rivet is inserted through the fastener receiving area 41 and the fastener thruway 62, the compressible arms 82 are forced together. Once the distal end of the rivet has emerged from the second fastener receiving area 41, the compressible arms 82 will expand away from each other. Disposed on each of the compressible arms 82 will then meet with a flange disposed around a circumference of the opposing receiving area 41, thus ensuring the co-edge connector 8 remains mated with the mezzanine board 10.

Figure 9:
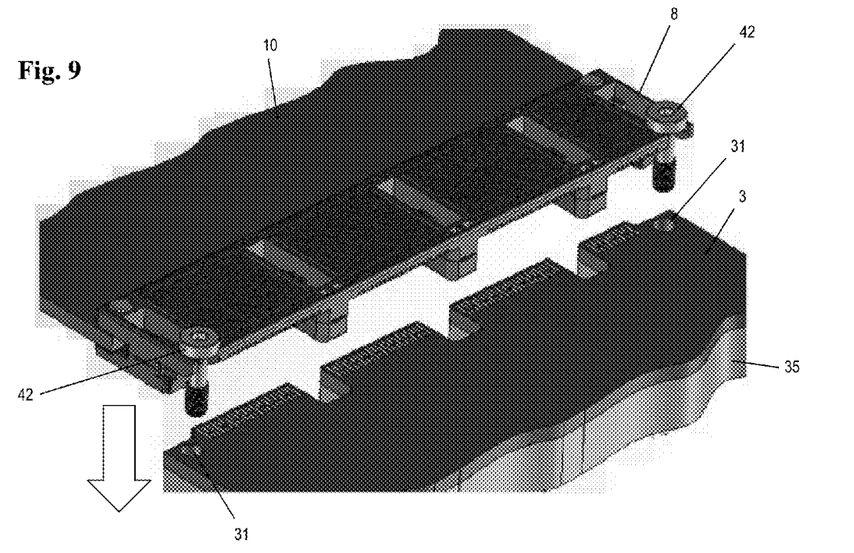
FIG. 9 illustrates aspects of mounting the mezzanine board with the co-edge connector to a motherboard.

Referring to FIG. 9, aspects of an exemplary process used to couple the co-edge connector 8 to a motherboard 3 are shown. In this example, the co-edge connector 8 with the mezzanine board 10 secured thereto, is aligned over the motherboard 3. The co-edge connector 8 is then simply disposed over the motherboard 3, and screws 42 are set to secure a threaded portion into a respective motherboard fastener receiving areas 31. The motherboard fastening receiving area 31 may be disposed through the motherboard 3 and into an underlying heat sink 35, chassis or other such component. A cross-sectional view of the final assembly is depicted in FIG. 10.

Figure 10:
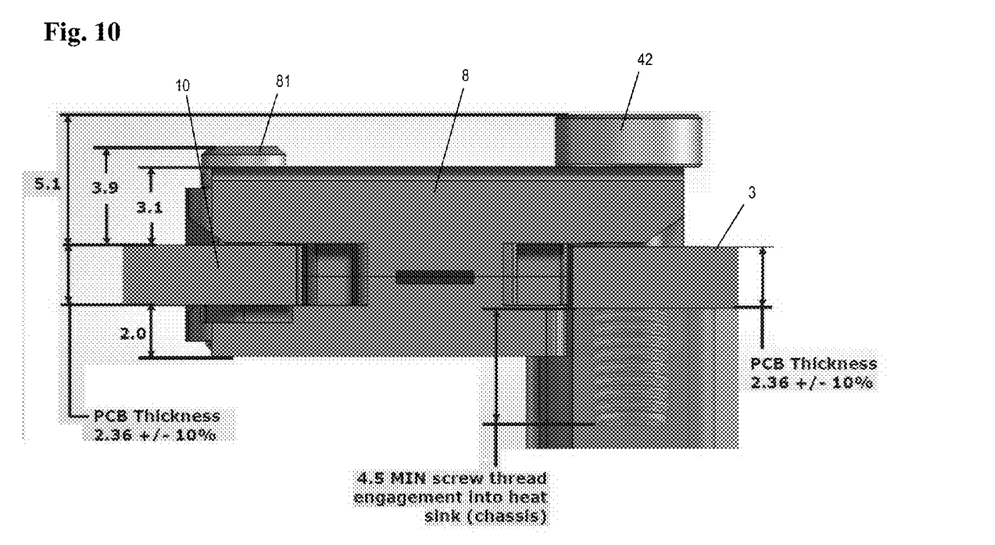
FIG. 10 is a cross-sectional view of the mezzanine board, the co-edge connector in the motherboard assembled together.

As shown in FIG. 10, the co-edge connector 8 provides for edge-to-edge electrical connection of the mezzanine board 10 with motherboard 3. The exemplary dimensions are included. The dimensions provided are in millimeters.

Figure 11:
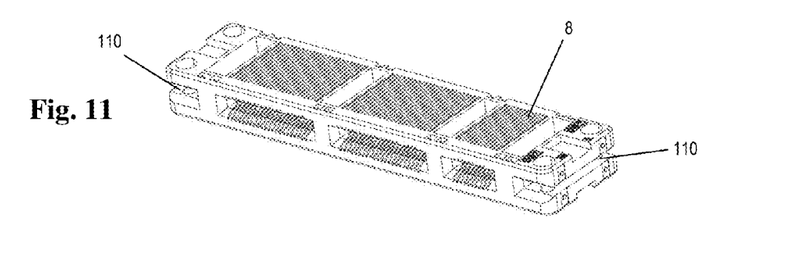
FIG. 11 is an additional embodiment of a co-edge connector.

FIG. 11 depicts another embodiment of the connector 8. As may be seen in this illustration, the connector 8 is also a co-edge style of connector, and includes an open area disposed at each end. Each open area is referred to as "dado 110." Generally, the dado 110 may be included to accommodate surrounding portions of the mezzanine board 10 and/or motherboard 3.

Figure 12A:
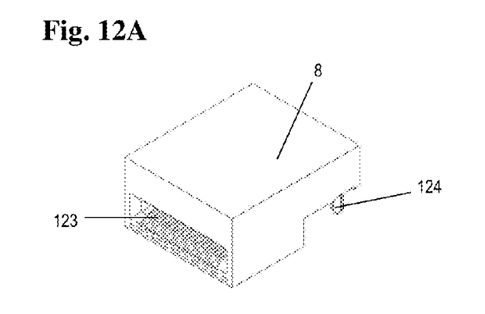
FIGS. 12A and 12B, collectively referred to herein as FIG. 12, depicts aspects of co-planar connector.
Figure 12B:
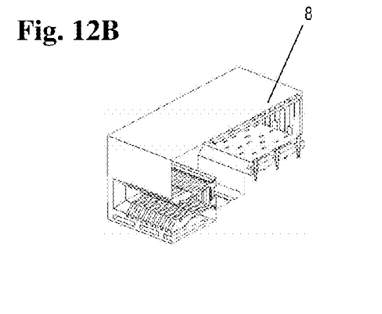

FIG. 12 depicts another embodiment of the connector 8. In this embodiment, the connector 8 is referred to as a "co-planar connector 8." Generally, the co-planar connector 8 may be mounted directly onto the motherboard 3 and secured with at least one guide 124 that meets with the motherboard 3. The at least one guide 124 may be configured for providing a friction fit with the motherboard 3. The at least one guide 124 have a particular geometry so as to be interlocking with the motherboard 3. Other techniques known in the art may be used to secure the co-planar connector 8 to the motherboard. In this embodiment, the co-planar connector 8 includes a receiving area 123. The receiving area 123 includes a plurality of spring-loaded electrical contacts. Accordingly, contacts on the mezzanine board 10 may simply be inserted into the receiving area 123, the electrical contacts of which provides for adequate retention of the mezzanine board.

Figure 13:
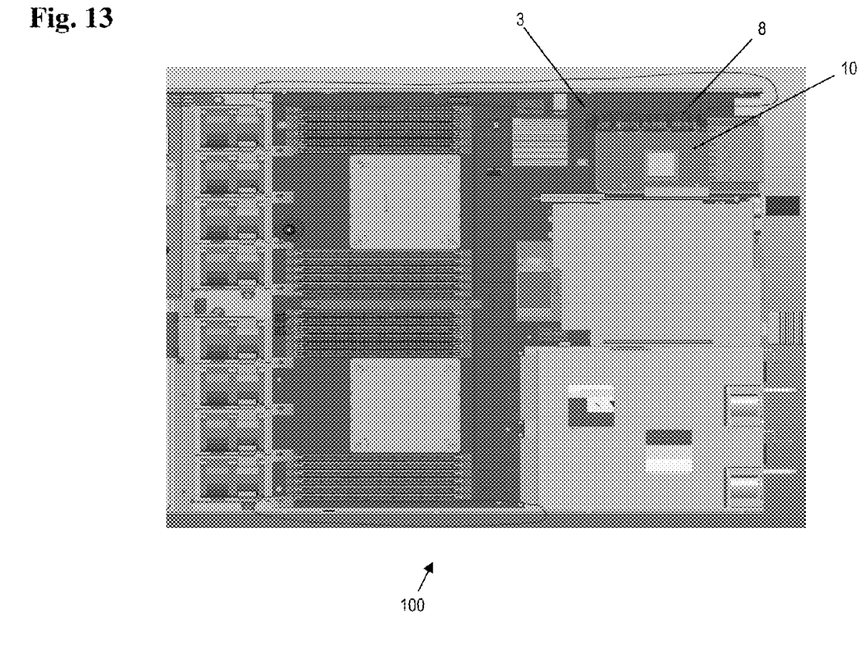
FIG. 13 is an illustration of a server that includes the mezzanine board coupled to the motherboard by use of the co-edge connector

FIG. 13 depicts aspects of a computing system 100. In this example, the computing system 100 is a server. The mezzanine board 10 is disposed within the server. The mezzanine board 10 is coupled to the motherboard 3 of the server using an embodiment of the co-edge connector 8. In this example, the mezzanine board 10 is a side-mount board 6, and the server is a 1U server. That is, the server includes a form factor that is somewhat less than two inches in height. Accordingly, by using the co-edge connector 8, it is possible to insert and configure the mezzanine board 10 into the server. That is, the co-edge connector 8 makes it possible to orient the mezzanine board 10 within the computing system 100.

Having introduced aspects for coupling a circuit board with a motherboard, some additional embodiments and aspects are presented.

Generally, the methods and apparatus provide for coupling the circuit board with a motherboard this may not otherwise be possible. For example, in the case of FIG. 13, a circuit board that is configured according to the PCI express standard will not fit within a 1U server chassis. By making use of the co-edge connector, it is possible to incorporate a circuit board that is sized according to the PCI express standard, and to configure and use that circuit board with the server.

Generally, embodiments of connectors support data transfer rates of up to about 25 Gbps. The connectors may be configured to accommodate printed circuit boards (PCB) having a variety of thicknesses. For example, the printed circuit boards (PCB) may range from about 1.5 mm to about 3.2 mm in thickness. The connectors may include press-fit, compliant-pin terminal options. The connectors may be configured to enable high-speed, pick-and-place assembly, as well as back-to-back connector placement.

A circuit board making use of connectors configured according to the disclosure herein may also make use of intermediate components, such as the adapter shown in FIG. 3. More specifically, at least one adapter may be used with the connector.

In other embodiments, the computing system is one of a laptop, a desktop, another server (of a differing size), or another form of computer. In general, it may be considered that the computing system exhibits a "low profile." That is, the computing system exhibits a geometry that is not conducive to installation and use of a standard size circuit board, such as a circuit board sized according to standards governing PCI Express. By way of example, the computing system may have a chassis that is has an internal usable height that is less than the height, H, (as depicted in FIGS. 1 and 2) of a respective circuit board. Examples of low profile computing systems include servers that are referred to as 1U and 2U servers, as well as a myriad of embodiments of laptop computers. Generally, the terminology "U" is with reference to the Electronic Industries Alliance standard EIA-310-D, "Cabinets, Racks, Panels, and Associated Equipment"; Consumer Electronics Association CEA-310-E "Design Requirements for Cabinets, Panels, Racks and Subracks," as well as any other standards that have adopted this convention.

By making use of the connector such as the co-edge connector, it is possible to make a mezzanine style connection with no mezzanine option has been previously unavailable. Accordingly, it is possible to enable services such as local area networking (LAN), to route external connections from a server in ways not previously achievable, and to incorporate larger heat sinks as well as higher power devices.

The circuit board may provide a variety of services or functionality. The circuit board may include, for example, a graphics adapter, a memory board, a controller for data storage (such as a RAID controller, an ADD controller, a SATA controller), a network interface controller (NIC), an additional central processing unit (CPU), a wireless interface (such as one using a Bluetooth, Wi-Fi or other protocol), an analog to digital or digital to analog converter, a modem, a security device, and accelerator, a sound card, and other types of extensions.

The use of this new co-bridge mezzanine board will allow any vendor/application/location in the server to use the same board universally, and still take advantage of the cost savings of the application specifics. The same connector can be used for other types of mezzanine applications and still be cost effective. Airflow is maximized with a universal design. Latching mechanisms may be universal front, back or side or any other style mounting deemed appropriate.

Exemplary embodiments of suitable connectors are available from Molex Inc. of Lisle, Ill. Embodiments include a variety of connectors marketed as EDGELINE high-speed connectors.

Conventional installations may benefit from the disclosed techniques for connecting mezzanine boards. For example, in other embodiments, such as a side-by-side (substantially parallel) and upright installation of a plurality of mezzanine boards, the density of boards used may be increased. That is, for example, edge-to-edge connections exhibit a low-profile (see FIG. 10) and therefore more installations of mezzanine boards may be realized within a given length of available chassis, when the mezzanine boards are connected to the motherboard and substantially parallel to one another. That is, the edge-to-edge connection provides for higher density of installation than previously achievable.

Various other components may be included and called upon for providing for aspects of the teachings herein. For example, additional materials, combinations of materials and/or omission of materials may be used to provide for added embodiments that are within the scope of the teachings herein.

When introducing elements of the present invention or the embodiment(s) thereof, the articles "a," "an," and "the" are intended to mean that there are one or more of the elements. Similarly, the adjective "another," when used to introduce an element, is intended to mean one or more elements. The terms "including" and "having" are intended to be inclusive such that there may be additional elements other than the listed elements.

While the invention has been described with reference to exemplary embodiments, it will be understood by those skilled in the art that various changes may be made and equivalents may be substituted for elements thereof without departing from the scope of the invention. In addition, many modifications will be appreciated by those skilled in the art to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A computing system comprising: a low-profile chassis comprising a motherboard disposed therein, the system configured to accommodate installation of a circuit board having a height that is dimensionally smaller than the height of a standard height PCI Express board; and
at least one circuit board that is standard height PCI Express dimensionally compliant coupled to the motherboard within the chassis; wherein the circuit board is coupled to the motherboard by an adapter and a co-edge connector that provides for edge-to-edge electrical connection of a longitudinal edge of the circuit board with the adapter and reduces the height of the installation permitting the circuit board to fit within the chassis; wherein a rivet with compressible arms is pushed into a thruway on the co-edge connector and a hole on the circuit board until the arms are expanded around a depressed circumference flange.

2. The computing system as in claim 1, wherein the low-profile chassis comprises dimensions for one of a 1U computer server and a 2U computer server.

3. The computing system as in claim 1, wherein the low-profile chassis comprises a laptop computer.

4. The computing system as in claim 1, wherein the circuit board comprises a standard height PCI Express compliant circuit board that is one of a half card length and a full card length.

5. The computing system as in claim 1, wherein the circuit board is coupled to the motherboard with a connector which is also connected to an adapter.

6. The computing system as in claim 1, wherein the circuit board comprises one of: a local area network (LAN) interface, a graphics adapter, a memory board, a controller for a data storage system, a network interface controller (NIC), an additional central processing unit (CPU), a wireless interface, at least one of an analog to digital converter and a digital to analog converter, a modem, a security device, and accelerator, and a sound card.

7. A method for retrofit of a low-profile computing system, the method comprising: selecting a circuit board that is standard height PCI Express dimensionally compliant for use with the low-profile computing system; coupling a co-edge connector that provides for edge-to-edge electrical connection of the circuit board with the motherboard to the circuit board; orienting the full size circuit board to fit within a chassis of the low-profile computing system, the chassis being configured to accommodate installation of a circuit board having a height that is dimensionally smaller than the height of a standard height PCI Express board; and coupling four bays of the co-edge connector to four fingers located on a motherboard of the low-profile computing system in a direction perpendicular to a greatest top surface of the mother board; and a fastener inserted through the co-edge connector, the mother board and a heat sink layer underlying the mother board opposite to the top surface.

8. A computing system comprising: a chassis comprising a motherboard disposed therein and a plurality of mezzanine boards coupled to the motherboard, each mezzanine board substantially parallel to another one of the mezzanine boards and coupled to the motherboard with an edge-to-edge connector which is polarized with four bays that provides for edge-to-edge electrical connection and fit into four corresponding fingers of the respective mezzanine board with the motherboard and reduces the height of the installation permitting each mezzanine board to fit within the chassis; wherein a rivet with compressible arms is pushed into a thruway on the edge-to-edge connector and a hole on the respective mezzanine board until the arms are expanded around a depressed circumference flange.

9. The computing system as in claim 8, wherein the mezzanine board comprises one of: a local area network (LAN) interface, a graphics adapter, a memory board, a controller for a data storage system, a network interface controller (NIC), an additional central processing unit (CPU), a wireless interface, at least one of an analog to digital converter and a digital to analog converter, a modem, a security device, and accelerator, and a sound card.

10. The computing system as in claim 1, wherein the co-edge connector comprises a plurality of bays, each bay for receiving electrical contacts of a respective one of the circuit board and the motherboard.

11. The computing system as in claim 1, wherein the co-edge connector comprises a fastener receiving area configured for receiving a fastener configured for fastening the co-edge connector to a respective one of the circuit board and the motherboard.

12. The computing system as in claim 11, wherein the fastener receiving area comprises a thruway.

13. The computing system as in claim 11, wherein the fastener receiving area is configured to receive one of a screw and a push fastener with compressible arms.

14. The computing system as in claim 1, wherein the co-edge connector provides edge-to-edge alignment of the circuit board and the motherboard.

15. The computing system as in claim 1, wherein the co-edge connector is polarized.

16. The computing system as in claim 1, wherein the co-edge connector comprises four bays and electrical contacts for seventy-six circuits.

* * * * *